United States Patent
Wachi et al.

(10) Patent No.: US 7,214,269 B2
(45) Date of Patent: May 8, 2007

(54) SI-DOPED GAAS SINGLE CRYSTAL SUBSTRATE

(75) Inventors: Michinori Wachi, Hitachi (JP); Kenya Itani, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 216 days.

(21) Appl. No.: 10/964,819

(22) Filed: Oct. 15, 2004

(65) Prior Publication Data
US 2006/0081306 A1 Apr. 20, 2006

(51) Int. Cl.
*C30B 11/04* (2006.01)
(52) U.S. Cl. .......................... 117/81; 117/83
(58) Field of Classification Search .......... 117/81, 117/83
See application file for complete search history.

(56) References Cited

U.S. PATENT DOCUMENTS 4,756,792 A * 7/1988 Fujita et al. ............... 117/93
5,728,212 A * 3/1998 Inoue et al. ................ 117/19

FOREIGN PATENT DOCUMENTS

| JP | 5-70276 A | 3/1993 |
| JP | 2003118078 | * 4/2003 |

* cited by examiner

*Primary Examiner*—Felisa Hiteshew
(74) *Attorney, Agent, or Firm*—Foley & Lardner LLP

(57) ABSTRACT

A Si-doped gallium arsenide single crystal substrate has a carrier concentration of $0.1 \times 10^{18}$ to $5.0 \times 10^{18}/cm^3$. The substrate is made by Vertical Bridgeman (VB) method or Vertical Gradient Freeze (VGF) method, and a minimum value and a maximum value of the carrier concentration in substrate plane are within a dispersion of 10% or less of an average carrier concentration in substrate plane.

4 Claims, 1 Drawing Sheet

SI-DOPED GAAS SINGLE CRYSTAL SUBSTRATE

BACKGROUND OF THE INVENTION

1. Field of the Invention

This invention relates to a Si-doped gallium arsenide (GaAs) single crystal substrate made by using Vertical Bridgeman (VB) or Vertical Gradient Freeze (VGF), and more particularly to the Si-doped gallium arsenide (GaAs) single crystal substrate that is used as a substrate in fabricating an LED (Light Emitting Diode) or LD (Laser Diode).

2. Description of the Related Art

A compound semiconductor single crystal such as gallium arsenide (GaAs) used as a substrate is conventionally made by various industrial methods such as Horizontal Bridgeman (HB), Liquid Encapsulated Czochralski (LEC), Vertical Bridgeman (VB) and Vertical Gradient Freeze (VGF). For example, Japanese patent application laid-open No. 5-70276 discloses an apparatus for making a group III–V or II–VI compound semiconductor single crystal by using the methods.

Among the above methods, VB and VGF are promising methods for making a good crystal with a lower dislocation density at a lower cost than the other methods. The method of making GaAs single crystal by VB or VGF is conducted such that a seed crystal is disposed at the bottom of a crucible and a solid raw material is disposed over the seed crystal, then the upper part of the seed crystal is melt while melting all the solid raw material, then the raw-material melt is cooled such that it is gradually solidified from the vicinity of seed crystal to the upper side, thereby growing the single crystal.

SUMMARY OF THE INVENTION

Although a Si-doped GaAs single crystal substrate obtained by the VB or VGF method has a good crystalline quality with a lower dislocation density than that by the other methods, it is intended by the inventors that the product quality can be further improved by controlling the carrier concentration distribution in substrate plane. This is because, in using the Si-doped GaAs single crystal substrate for the fabrication of an optical device, the uniformity of carrier concentration in substrate plane is required in terms of production yield (=ratio of usable devices to all devices taken from a single substrate) or matching of manufacturing condition in the fabrication of device.

It is an object of the invention to provide a Si-doped GaAs single crystal substrate that can offer a significantly enhanced production yield of device and that can facilitate the matching of manufacturing condition in the fabrication of device.

According to the first aspect of the invention, a Si-doped gallium arsenide single crystal substrate has:

a carrier concentration of $0.1 \times 10^{18}$ to $5.0 \times 10^{18}/cm^3$, wherein the substrate is made by Vertical Bridgeman (VB) method or Vertical Gradient Freeze (VGF) method, and a minimum value and a maximum value of the carrier concentration in substrate plane are within a dispersion of 10% or less of an average carrier concentration in substrate plane.

When a Si-doped gallium arsenide single crystal substrate is used in fabricating a device such as an optical device, it is found that a production yield of element obtained from one substrate correlates with an in-plane distribution of carrier concentration of the Si-doped gallium arsenide single crystal substrate used.

As the uniformity of in-plane carrier concentration of the Si-doped gallium arsenide single crystal substrate used increases, the production yield of element in fabricating the device increases. Also, as the uniformity of in-plane carrier concentration of the Si-doped gallium arsenide single crystal substrate used increases, the matching of manufacturing condition in fabricating the device can be facilitated.

Thus, by the first aspect of the invention, where a carrier concentration is in the range of $0.1 \times 10^{18}$ to $5.0 \times 10^{18}/cm^3$ and a minimum value and a maximum value of the carrier concentration in substrate plane are within a dispersion of 10% or less of an average carrier concentration in substrate plane, the production yield of element in fabricating the device can be increased, and the matching of manufacturing condition in fabricating the device can be facilitated.

According to the second aspect of the invention, the abovementioned Si-doped gallium arsenide single crystal substrate has in its plane a nearly circular and annular ring-shaped growth fringe to indicate a constant-carrier concentration, and the center of the growth fringe is located within 1/20 of a diameter of the substrate from the center of the substrate.

As the center of the growth fringe comes close to the center of the substrate, the production yield of element in fabricating the device can be increased, and the matching of manufacturing condition in fabricating the device can be facilitated.

Thus, by the second aspect of the invention, where the center of the growth fringe is located within 1/20 of a diameter of the substrate from the center of the substrate, the production yield of element in fabricating the device can be increased, and the matching of manufacturing condition in fabricating the device can be facilitated.

According to the third aspect of the invention, the abovementioned Si-doped gallium arsenide single crystal substrate has a dislocation density of $5,000/cm^2$ or less, as an average value, in its plane.

As the dislocation density of Si-doped gallium arsenide single crystal substrate used lowers, the production yield of element in fabricating the device can be increased, and the lifetime of device can be elongated.

Thus, by the third aspect of the invention, where the substrate has a dislocation density of $5,000/cm^2$ or less, as an average value, in its plane, the production yield of element in fabricating the device can be increased, and the lifetime of device can be elongated.

BRIEF DESCRIPTION OF THE DRAWINGS

The preferred embodiments according to the invention will be explained below referring to the drawing, wherein.

DETAILED DESCRIPTION OF THE PREFERRED EMBODIMENTS

Figure 1:
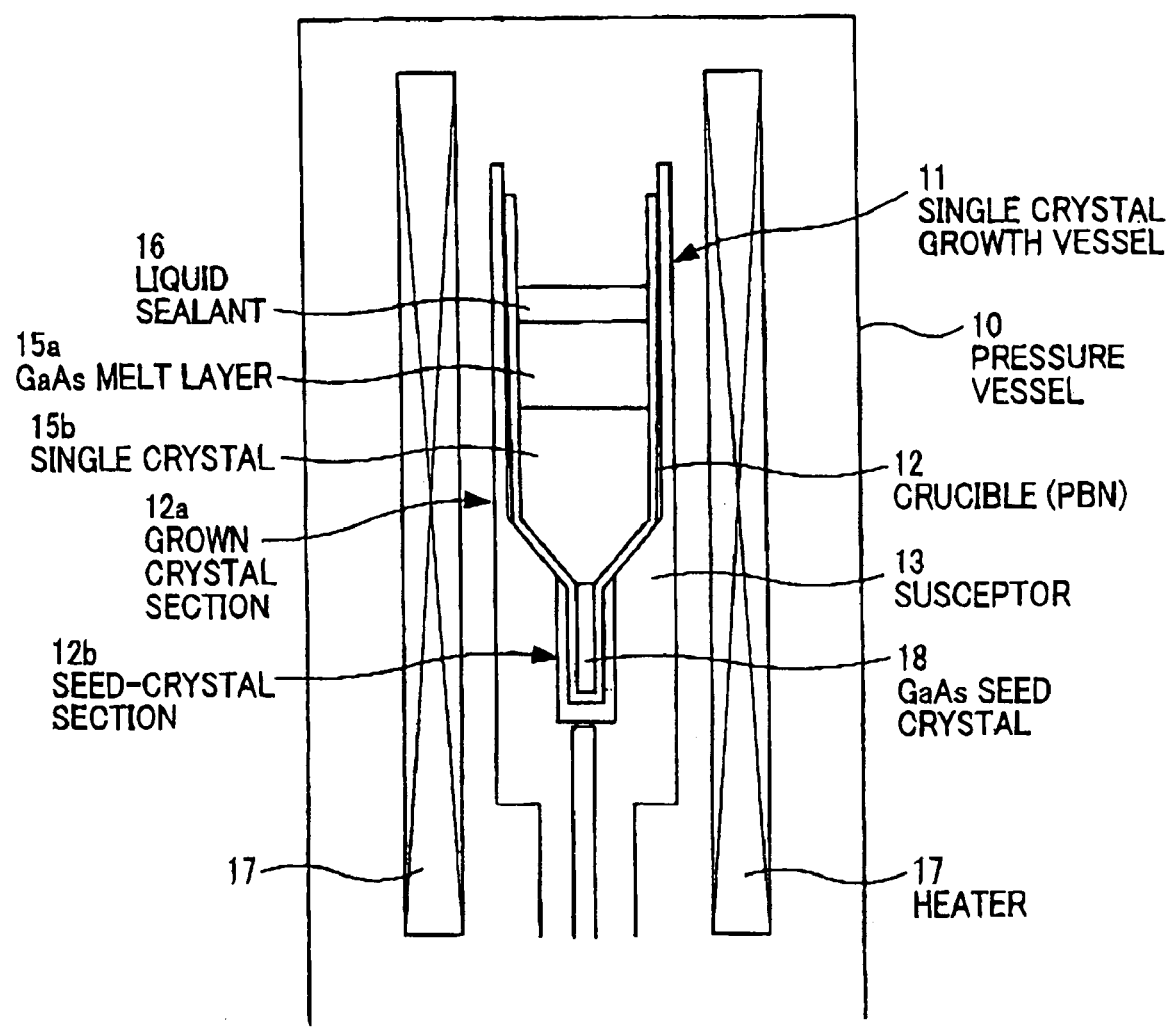
FIG. 1 is a cross sectional view showing a single crystal manufacturing apparatus used in the invention.

FIG. 1 is a cross sectional view showing a single crystal manufacturing apparatus for VB method used in the invention. A single crystal growth vessel 11 is composed of a crucible 12 of PBN (pyrolytical boron nitride) and a susceptor 13 to hold the crucible 12. The dimensions of the crucible 12 are a diameter of 80 mm in a grown crystal section 12a, a length of 300 mm in the grown crystal section 12a, and a diameter of 10 mm in a seed-crystal section 12b.

In operation, at first, a GaAs seed crystal 18 is inserted in a bottom portion of the PBN crucible 12. Then, 7,900 g of GaAs polycrystalline material as a GaAs melt layer 15a, 800 g of boron trioxide as a liquid sealant 16, and silicon (Si) to give a carrier concentration of $1.0\times10^{18}$/cm$^3$ on the seed-crystal side of the grown crystal section 12a are added therein. The single crystal growth vessel 11 is loaded into a pressure vessel 10, inert gas is introduced replacing internal gas in the pressure vessel 10, and power is supplied to a heater 17 such that the GaAs polycrystalline material is melt as the GaAs melt layer 15a to implant the seed. Setting a temperature gradient of 5° C./cm in the vicinity of the seed-implanted portion, a single crystal 15b is grown by the VB method that the single crystal growth vessel 11 descends at a speed of 5 mm/hr. After the crystal growth, a grown crystal is taken out with the single crystal growth vessel 11 from the pressure vessel 10.

The temperature control is accurately conducted such that, in the entire cross section region, the temperature gradient in the cross section perpendicular to the crystal growth direction in the vicinity of the solid-liquid interface between the melt and the crystal falls within ±0.2° C., though it was conventionally±several degrees. It is assumed that the most effective measure for enhancing the accuracy in temperature control is that the internal pressure of the pressure vessel is reduced to 0.2 MPa, though it was conventionally 0.8 MPa, so as to allow a reduction in gaseous convection inside the pressure vessel.

The grown crystal is a single crystal. The single crystal is cut in the horizontal direction and then mirror-finished by lapping and polishing to obtain a conductive Si-doped GaAs single crystal substrate.

In measuring the carrier concentration of the substrate, $1.0\times10^{18}$/cm$^3$ is obtained on the crystal seed side within the crystal growth section, and $2.1\times10^{18}$/cm$^3$ on the other side. Thus, the minimum value and maximum value of carrier concentration in substrate plane fall within a dispersion of 10% or less of an average carrier concentration in substrate plane. When nearly circular and annular ring-shaped growth fringes on the substrate are exposed by AB etching, the center of the growth fringes is located within 1/20 of substrate diameter from the center of substrate. The dislocation density is 5,000/cm$^2$ or less, as an average value in substrate plane.

A reliability test (lifetime test) for LED's fabricated from all the in-plane regions of the Si-doped GaAs single crystal substrate is conducted under conditions mentioned below.

<Reliability Test Conditions>:

High-temperature reliability test; retained for 1000 hours at a temperature of 85° C. and a humidity of 85%

Low-temperature reliability test; retained for 1000 hours at a temperature of –40° C.

In the reliability test, if an emission brightness of 70% or more as compared to that obtained before the test is obtained after 1000 hours elapse, it is determined "passed". As a result of the reliability test, in all substrates, 99 to 100% of LED's fabricated are passed.

As mentioned above, in the embodiment, the Si-doped single crystal substrate has the carrier concentration of the substrate that is $1.0\times10^{18}$/cm$^3$ on the crystal seed side within the crystal growth section, and $2.1\times10^{18}$/cm$^3$ on the other side. Further, the minimum value and maximum value of carrier concentration in substrate plane fall within a dispersion of 10% or less of an average carrier concentration in substrate plane. Accordingly, the production yield (pass rate in reliability test) of element in the fabrication of optical device can be enhanced and the matching of manufacturing condition in the fabrication of device can be facilitated.

Further, since the center of the growth fringes is located within 1/20 of substrate diameter from the center of substrate, the production yield of element in the fabrication of optical device can be enhanced and the matching of manufacturing condition can be facilitated. Since the dislocation density is 5,000/cm$^2$ or less, as an average value in substrate plane, the production yield (pass rate in reliability test) of element in the fabrication of optical device can be enhanced and the lifetime of optical device can be elongated.

Accordingly, when the Si-doped GaAs single crystal substrate in the embodiment is used to make an optical device, the production yield (pass rate in reliability test) of element to be obtained from one substrate can be significantly enhanced and the matching of manufacturing condition in the fabrication of device can be facilitated. Thus, the economic effects in industrial production can be significant.

Although in the embodiment the Si-doped GaAs single crystal substrate is made by using the VB method, the same effects can be also obtained when Si-doped GaAs single crystal substrate is made by using the VGF method. Further, when the invention is also applied to a compound semiconductor single crystal substrate that is of InP, GaP, InAs etc. other than GaAs to be made by the VB or VGF method, the same effects can be obtained.

EXAMPLE 1

FIG. 1 is a cross sectional view showing the single crystal manufacturing apparatus for VB method used in this example. The single crystal growth vessel 11 is composed of the crucible 12 of PBN (pyrolytical boron nitride) and the susceptor 13 to hold the crucible 12. The dimensions of the crucible 12 are a diameter of 80 mm in the grown crystal section 12a, a length of 300 mm in the grown crystal section 12a, and a diameter of 10 mm in the seed-crystal section 12b.

In operation, at first, the GaAs seed crystal 18 is inserted in the bottom portion of the PBN crucible 12. Then, 7,900 g of GaAs polycrystalline material as the GaAs melt layer 15a, 800 g of boron trioxide as the liquid sealant 16, and silicon (Si) to give a carrier concentration of $1.0\times10^{18}$/cm$^3$ on the seed-crystal side of the grown crystal section 12a are added therein. The single crystal growth vessel 11 is loaded into the pressure vessel 10, inert gas is introduced replacing internal gas in the pressure vessel 10, and power is supplied to the heater 17 such that the GaAs polycrystalline material is melt as the GaAs melt layer 15a to implant the seed. Setting a temperature gradient of 5° C./cm in the vicinity of the seed-implanted portion, the single crystal 15b is grown by the VB method that the single crystal growth vessel 11 descends at a speed of 5 mm/hr. After the crystal growth, the grown crystal is taken out with the single crystal growth vessel 11 from the pressure vessel 10.

In this example, in order to enhance the accuracy in temperature control, the internal pressure of the pressure vessel is reduced to 0.2 MPa, though it was conventionally 0.8 MPa. Thereby, gaseous convection inside the pressure vessel can be successfully reduced. As such, the temperature control is accurately conducted such that, in the entire cross section region, the temperature gradient in the cross section perpendicular to the crystal growth direction in the vicinity of the solid-liquid interface between the melt and the crystal falls within ±0.2° C.

The single crystal, which is made subjected to the temperature control more accurate than conventional one, is sliced to obtain Si-doped GaAs single crystal substrates. The Si-doped GaAs single crystal substrate has a carrier concentration of $0.1 \times 10^{18}$ to $5.0 \times 10^{18}/cm^3$. The minimum value and maximum value of carrier concentration in substrate plane fall within a dispersion of 10% or less of an average carrier concentration in substrate plane. The center of the growth fringes is located within 1/20 of substrate diameter from the center of substrate. The dislocation density is $5,000/cm^2$ or less, as an average value in substrate plane.

LED's are fabricated from the 100 Si-doped GaAs single crystal substrates and are subjected to the reliability test. As a result, in all substrates, the production yield (pass rate of reliability test) of element to be obtained from one substrate is 99 to 100%.

Alternatively, when the Si-doped GaAs single crystal substrate is made by using the VGF method, though the other conditions are the same as those described above, the substrate has the same properties as those of the substrate made by the VB method, the production yield (pass rate of reliability test) of element to be obtained from one substrate is 99 to 100%.

EXAMPLE 2

Si-doped GaAs single crystal substrates are fabricated by the same method (VB method is used) as Example 1. Although the carrier concentration of the substrate is not in the range of $0.1 \times 10^{18}$ to $5.0 \times 10^{18}/cm^3$, the substrate has such properties that, like the substrate of Example 1, the minimum value and maximum value of carrier concentration in substrate plane fall within a dispersion of 10% or less of an average carrier concentration in substrate plane, the center of the growth fringes is located within 1/20 of substrate diameter from the center of substrate, and the dislocation density is $5,000/cm^2$ or less, as an average value in substrate plane.

LED's are fabricated from the 100 Si-doped GaAs single crystal substrates and are subjected to the reliability test. As a result, in all substrates, the production yield (pass rate of reliability test) of element to be obtained from one substrate is 90% at a maximum.

Alternatively, when the Si-doped GaAs single crystal substrate is made by using the VGF method, though the other conditions are the same as those described above, the substrate has the same properties as those of the substrate made by the VB method, the production yield (pass rate of reliability test) of element to be obtained from one substrate is 90% at a maximum.

Meanwhile, both in the VB method and in the VGF method, as the carrier concentration is away from the range of $0.1 \times 10^{18}$ to $5.0 \times 10^{18}/cm^3$, the production yield (pass rate of reliability test) of element to be obtained from one substrate is likely to decrease.

EXAMPLE 3

Si-doped GaAs single crystal substrates are fabricated by the same method (VB method is used) as Example 1. Although the minimum value and maximum value of carrier concentration in substrate plane are not within a dispersion of 10% of an average carrier concentration in substrate plane, the substrate has such properties that, like the substrate of Example 1, the carrier concentration of the substrate is in the range of $0.1 \times 10^{18}$ to $5.0 \times 10^{18}/cm^3$, the center of the growth fringes is located within 1/20 of substrate diameter from the center of substrate, and the dislocation density is $5,000/cm^2$ or less, as an average value in substrate plane.

LED's are fabricated from the 100 Si-doped GaAs single crystal substrates and are subjected to the reliability test. As a result, in all substrates, the production yield (pass rate of reliability test) of element to be obtained from one substrate is 92% at a maximum.

Alternatively, when the Si-doped GaAs single crystal substrate is made by using the VGF method, though the other conditions are the same as those described above, the substrate has the same properties as those of the substrate made by the VB method, the production yield (pass rate of reliability test) of element to be obtained from one substrate is 92% at a maximum.

Meanwhile, both in the VB method and in the VGF method, as the minimum value and maximum value of carrier concentration in substrate plane are away from a dispersion of 10% of an average carrier concentration in substrate plane, the production yield (pass rate of reliability test) of element to be obtained from one substrate is likely to decrease.

EXAMPLE 4

Si-doped GaAs single crystal substrates are fabricated by the same method (VB method is used) as Example 1. Although the center of the growth fringes is not located within 1/20 of substrate diameter from the center of substrate, the substrate has such properties that, like the substrate of Example 1, the carrier concentration of the substrate is in the range of $0.1 \times 10^{18}$ to $5.0 \times 10^{18}/cm^3$, the minimum value and maximum value of carrier concentration in substrate plane are within a dispersion of 10% of an average carrier concentration in substrate plane, and the dislocation density is $5,000/cm^2$ or less, as an average value in substrate plane.

LED's are fabricated from the 100 Si-doped GaAs single crystal substrates and are subjected to the reliability test. As a result, in all substrates, the production yield (pass rate of reliability test) of element to be obtained from one substrate is 93% at a maximum.

Alternatively, when the Si-doped GaAs single crystal substrate is made by using the VGF method, though the other conditions are the same as those described above, the substrate has the same properties as those of the substrate made by the VB method, the production yield (pass rate of reliability test) of element to be obtained from one substrate is 93% at a maximum.

Meanwhile, both in the VB method and in the VGF method, as the center of the growth fringes is away from 1/20 of substrate diameter from the center of substrate, the production yield (pass rate of reliability test) of element to be obtained from one substrate is likely to decrease.

EXAMPLE 5

Si-doped GaAs single crystal substrates are fabricated by the same method (VB method is used) as Example 1. Although the dislocation density is greater than $5,000/cm^2$, as an average value in substrate plane, the substrate has such properties that, like the substrate of Example 1, the carrier concentration of the substrate is in the range of $0.1 \times 10^{18}$ to $5.0 \times 10^{18}/cm^3$, the minimum value and maximum value of carrier concentration in substrate plane are within a dispersion of 10% of an average carrier concentration in substrate plane, and the center of the growth fringes is located within 1/20 of substrate diameter from the center of substrate.

LED's are fabricated from the 100 Si-doped GaAs single crystal substrates and are subjected to the reliability test. As a result, in all substrates, the production yield (pass rate of reliability test) of element to be obtained from one substrate is 80% at a maximum.

Alternatively, when the Si-doped GaAs single crystal substrate is made by using the VGF method, though the other conditions are the same as those described above, the substrate has the same properties as those of the substrate made by the VB method, the production yield (pass rate of reliability test) of element to be obtained from one substrate is 80% at a maximum.

Meanwhile, both in the VB method and in the VGF method, as the dislocation density becomes greater than 5,000/cm$^2$, as an average value in substrate plane, the production yield (pass rate of reliability test) of element to be obtained from one substrate is likely to decrease.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A Si-doped gallium arsenide single crystal substrate, comprising:

a carrier concentration of $0.1 \times 10^{18}$ to $5.0 \times 10^{18}$/cm$^3$, wherein the substrate is made by a Vertical Bridgeman (VB) method or a Vertical Gradient Freeze (VGF) method, and wherein a minimum value and a maximum value of the carrier concentration in a substrate plane are within a range of 10% or less of an average carrier concentration in the substrate plane.

2. The Si-doped gallium arsenide single crystal substrate according to claim 1, wherein:

the substrate has in its plane a nearly circular and annular ring-shaped growth fringe to indicate a constant-carrier concentration, and the center of the growth fringe is located within 1/20 of a diameter of the substrate from the center of the substrate.

3. The Si-doped gallium arsenide single crystal substrate according to claim 2, wherein:

the substrate has a dislocation density of 5,000/cm$^2$ or less, as an average value, in its plane.

4. The Si-doped gallium arsenide single crystal substrate according to claim 1, wherein:

the substrate has a dislocation density of 5,000/cm$^2$ or less, as an average value, in its plane.

* * * * *